United States Patent
Yeung et al.

(10) Patent No.: US 7,660,186 B2
(45) Date of Patent: Feb. 9, 2010

(54) MEMORY CLOCK GENERATOR HAVING MULTIPLE CLOCK MODES

(75) Inventors: Gus Yeung, Austin, TX (US);
Yew-Keong Chong, New Braunfels, TX (US)

(73) Assignee: ARM Limited, Cambridge (GB)

( * ) Notice: Subject to any disclaimer, the term of this patent is extended or adjusted under 35 U.S.C. 154(b) by 9 days.

(21) Appl. No.: 11/907,818

(22) Filed: Oct. 17, 2007

(65) Prior Publication Data
US 2009/0103391 A1 Apr. 23, 2009

(51) Int. Cl.
*G11C 8/00* (2006.01)
(52) U.S. Cl. ................. 365/233.1; 365/233.12
(58) Field of Classification Search ............ 365/233.12, 365/211
See application file for complete search history.

(56) References Cited

U.S. PATENT DOCUMENTS

| | | | | |
|---|---|---|---|---|
| 5,432,747 A | * | 7/1995 | Fuller et al. | 365/203 |
| 5,905,691 A | * | 5/1999 | Tanzawa et al. | 365/233.1 |
| 5,956,290 A | * | 9/1999 | Matsuzaki | 365/233.1 |
| 6,262,940 B1 | * | 7/2001 | Choi et al. | 365/233.1 |
| 6,618,313 B2 | * | 9/2003 | Nguyen et al. | 365/227 |
| 7,345,950 B2 | * | 3/2008 | Fujisawa et al. | 365/233.12 |

* cited by examiner

*Primary Examiner*—Tan T. Nguyen
(74) *Attorney, Agent, or Firm*—Nixon & Vanderhye P.C.

(57) ABSTRACT

An integrated circuit 2 with a memory 4 is provided with clock generator circuitry 18. The clock generator circuitry 18 operates in a first mode in which the memory clock signal mclk is generated in dependence upon both the rising edge and the falling edge of a source clock signal sclk. In a second mode of operation the clock generator circuitry 18 generates the memory clock signal mclk following the rising edge of the source clock signal sclk and then using a self-timing delay path 26 to trigger the falling edge of the memory clock signal mclk. The first mode of operation can be used during write operations and during read operations at the lowest one of a plurality of different dynamically selectable voltage levels of operation of the memory 4. The second mode of self-timed memory clock signal can be used during reads at operating voltages other than the lowest operating voltage.

63 Claims, 5 Drawing Sheets

MEMORY CLOCK GENERATOR HAVING MULTIPLE CLOCK MODES

BACKGROUND OF THE INVENTION

1. Field of the Invention

This invention relates to the field of integrated circuits. More particularly, this invention relates to the field of clock generators for a memory within an integrated circuit.

2. Description of the Prior Art

Clock signal generation for controlling memories within integrated circuits is a critical design challenge when seeking to obtain high speed performance coupled with low power consumption. It is known to use self-timed memories in which a clock pulse is generated triggered by one edge of a source clock signal and having a duration controlled by a model delay line seeking to represent the signal processing paths within the memory concerned. The principle of operation of such circuits is that variations in the speed of operation of the memory circuits, such as due to process, voltage and temperature fluctuations, will result in corresponding changes in the speed of operation of the delay lines modelling the memory behaviour and accordingly an appropriate adjustment will be made in the pulse duration such that the pulse will terminate at an appropriate time. If the pulse is too short, then the read operation may not have properly completed at the point at which the bit value is captured from the memory. Conversely, if the pulse is too long, then the voltage swinging on the bit lines in the memory may be unnecessarily large resulting in an unnecessary increase in energy consumed as well as the read speed being unnecessarily slowed.

An increasing trend within integrated circuits, including those incorporating memories, is to operate at lower voltages. Such lower voltages significantly reduce power consumption. However, lower operating voltages present additional challenges in the field of integrated circuit memories. Bit storage cells within memories are typically provided in the form of circuits using feedback to maintain a particular signal level representing either a "0" or a "1". In order to write a new bit value into such a storage location, a voltage needs to be applied which will overcome the feedback being used within the bit storage cell and accordingly impress the new signal value into that bit storage cell for subsequent maintenance by the feedback mechanism when the write value is no longer being driven into the bit storage cell. However, with the use of lower operating voltages there is a reduction in the margin associated with the write signal being able to overcome the feedback mechanisms within the bit storage cells. Furthermore, as device sizes tend to decrease, the variation in the characteristics of individual bit storage cells with variations in process, voltage and temperature which occur can have the result that bit cells may not be properly written as the write signal may not be able to overpower the feedback within the bit storage cell in the time provided by the memory clock signal (or at all).

One way of dealing with this problem would be to increase the pulse duration of the self-timed memory clocks to increase the time available for the write operation to be completed. However, this has the disadvantage that during a read operation such an excessively long pulse duration will result in the bit lines being unnecessarily discharged for a longer duration until read by the sense amplifiers. This will increase the power consumption of the memory in a disadvantageous manner. Furthermore, the process, voltage and temperature variations which alter the characteristics of the memory can also alter the performance characteristics of the clock generator. These variations in the clock generator characteristics may result in changes in the pulse duration opposite to the requirements for changes in the pulse duration which arise due to the same variations occurring within the memory. Thus, a change requiring a longer pulse duration for correction operation of the memory may in fact cause the clock generator to vary its performance in a way which actually reduces the pulse duration.

One way of dealing with this problem would be to adopt a memory clock which has its characteristics, i.e. its rising and falling edges, determined by a source clock signal from which it is derived. A source clock signal can be generated by a circuit such as a phase-locked-loop circuit and produce a source clock signal which is resistant to changes in process, voltage and temperature. Thus, by generating the memory clock signal in response to both the rising and falling edges of the source clock signal, the memory clock signal can be made to have more stable characteristics. Thus, such a memory clock signal can be used to control write operations in a manner in which the write operation will be assured to last for more than a known amount of time to help ensure that the feedback characteristics of bit storage cells will be overcome and a new data value will be properly written therein. However, such an approach to generating the memory clock signal has the result that it is no longer possible to obtain the performance and power consumption advantages associated with the self-timed type of memory clock signal generation. The type of memory clock signal derived from both rising and falling edges of a source clock signal will not be able to track the normal variations in process, voltage and temperature as is normally the case with such self-timed clocks. Thus, the integrated circuit memory will normally have to be configured with worst-case design assumptions in mind resulting in lower performance and higher power consumption.

SUMMARY OF THE INVENTION

Viewed from one aspect the present invention provides an integrated circuit comprising:

a memory; and clock generator circuitry having a source clock input to receive a source clock signal and a memory clock output coupled to said memory to supply a memory clock signal to said memory; wherein in a first mode of operation said clock generator circuitry generates said memory clock signal in response to rising and falling edges of said source clock signal; and in a second mode of operation said clock generator circuitry generates said memory clock signal as a self-timed pulse triggered in response to an edge of said source clock signal.

The present technique recognises the at least partially irreconcilable requirements placed upon the characteristics of a memory clock signal generator considered across the different operations performed by that memory and the different conditions under which that memory may operate. Having recognised these conflicting requirements, the present technique provides the solution of a clock signal generator with more than one mode of operation, namely a mode in which the memory clock signal is self-timed in response to an edge of the source clock signal and another mode in which the memory clock signal is generated in response to both the rising and falling edges of the source clock signal. Whilst the normal engineering prejudice would not be to provide multiple types of memory clock signal due to the overhead in terms of circuit area, complexity and cost associated with complicating the clock signal generator in this way, the present technique recognises that the overall benefits which can be achieved by the use of such a hybrid clock signal generator more than justify its provision. In particular, the mode of clock signal generation can be varied depending upon the operational mode and state of the integrated circuit containing the memory in a manner which overcomes, or at least significantly reduces, many of the above described difficulties and limitations.

As an example, the memory clock signal can be generated using the first mode of operation in which both rising and falling edges of the source clock signal are used to generate the memory clock signal when the integrated circuit including the memory is performing a write operation. This can effectively guarantee a minimum duration of the write operation in a manner which ensures that the new data values will overcome the feedback within the bit storage cells and be properly written.

In a similar way, during read operation the clock generator circuitry can either operate in the first mode or in a second mode, (i.e. self-timed starting from one edge of the source clock signal) in a manner which increases performance during read operations. Thus, a self-timed memory clock signal can be used when guaranteeing the minimum duration of the read operation is not a particular problem and accordingly the read speed and power consumption can be improved using the self-timed techniques. Conversely, if the integrated circuit happens to be operating in a particular state, e.g. at a particularly low operating voltage, in which read operation using a self-timed clock may not be reliable, then the first mode of clock signal generation using both rising and falling edges of the source clock signal can be employed to guarantee appropriate characteristics of the memory clock signal.

It will be appreciated that the memory within the integrated circuit can take a wide variety of different forms. As an example, the memory could be a block of Random Access Memory (RAM) such as is used in bulk memory integrated circuits. The present technique is also applicable with other forms of memory, such as a cache memory or a register file memory.

The usefulness of the present technique can be further enhanced in embodiments in which when operating in the second mode the clock generator circuitry is responsive to a pulse duration specifying signal to generate a memory clock signal as a self-timed pulse with a pulse duration controlled by the pulse duration specifying signal. The provision of a clock signal generator controllable in this way allows the integrated circuit designer/manufacturer to actively adjust the characteristics of the memory clock signal in the second mode of operation so as to tune the performance, power consumption and manufacturing yield characteristics of the integrated circuit in the manner they choose. Thus, an individual manufacturer can select an appropriate pulse duration to balance performance and power consumption against their desired manufacturing yield for their individual manufacturing process and intended application of the integrated circuit.

A particularly simple way in which the pulse duration specifying signal can be used to control the pulse duration is where the clock generator circuitry comprises a plurality of delay lines with one selected for use in dependence upon the pulse duration specifying signal.

An additional level of sophistication and control is one in which when the memory is operated using a dynamically selectable one of a plurality of different operating voltages, the pulse duration specifying signal being varied in dependence upon the operating voltage such that the pulse duration is varied to match the operating voltage. This technique recognises that the tradeoffs made in determining the pulse duration to be used vary with the operating voltage of the memory and accordingly providing dynamic variation of the pulse duration characteristics in accordance with the operating voltage reduces the degree to which compromises must be made when selecting the pulse duration characteristics.

Generally speaking, at the lowest operating voltage the safest clock generation mode will be the first mode where the memory clock signal is generated using characteristics of both the rising and falling edges of the source clock signal. Conversely, when operating with at least the highest operating voltage, it will generally be beneficial to use the generator clock circuitry in the second mode in which the memory clock signal is self-timed in order to realise the advantages associated with such self-timed operation.

In contrast to the dynamic behaviour discussed above, some applications may be suited to using a fixed value for the pulse duration specifying signal during operation of the integrated circuit. Such a fixed value could be set using fusible links during manufacture of the integrated circuit (either as a consequence of individual test, batch test or design test considerations) or alternatively may be programmed using a configuration register when initialising the integrated circuit (with a value determined in a similar way). The selection of either fixed or dynamic behaviour could also be made with such fusible links or a programmable configuration register.

The way in which pulse duration varies with the pulse duration specifying signal can take a wide variety of different forms. However, in order to provide improved design coverage it is appropriate that the variation is non-linear e.g. logarithmic, so that a wider range of possible pulse durations can be provided, including at least one very long pulse duration which is substantially guaranteed to work even if it may be performance limiting.

The source clock signal can be generated in a variety of different ways as will be familiar to those in this technical field. One particularly good way of generating a highly stable source clock signal is to use phase-locked-loop circuitry. This phase-locked-loop circuitry can be internal or external of the integrated circuit concerned.

As previously discussed, the different modes of operation of the clock generator circuitry are appropriate to different requirements. The first mode of operation is well suited to write operations of bit storage cells when it is desired to generate a memory clock signal substantially independent of variations dependent upon the individual instance of the integrated circuit concerned (e.g. process variations, operating voltage variations etc).

The use of the second mode of the clock generator circuitry is preferred when reading a bit value and using the active phase of the memory clock signal to control the period for which the bit lines are discharged and the trailing edge of the active phase to trigger sense amplifiers to read the signals from the bit lines.

Viewed from another aspect the present invention provides an integrated circuit comprising:

memory means; and clock generator means for generating a memory clock signal and having a source clock input to receive a source clock signal and a memory clock output coupled to said memory means to supply said memory clock signal to said memory means; wherein in a first mode of operation said clock generator means generates said memory clock signal in response to rising and falling edges of said source clock signal; and in a second mode of operation said clock generator means generates said memory clock signal as a self-timed pulse triggered in response to an edge of said source clock signal.

Viewed from a further aspect the present invention provides a method of operating an integrated circuit comprising the steps of:

storing data in a memory of said integrated circuit; and generating a memory clock signal from a source clock signal using a clock generator circuitry having a source clock input to receive said source clock signal and a memory clock output coupled to said memory to supply said memory clock signal to said memory; wherein in a first mode of operation said clock generator circuitry generates said memory clock signal in response to rising and falling edges of said source clock signal; and in a second mode of operation said clock generator circuitry generates said memory clock signal as a self-timed pulse triggered in response to an edge of said source clock signal.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
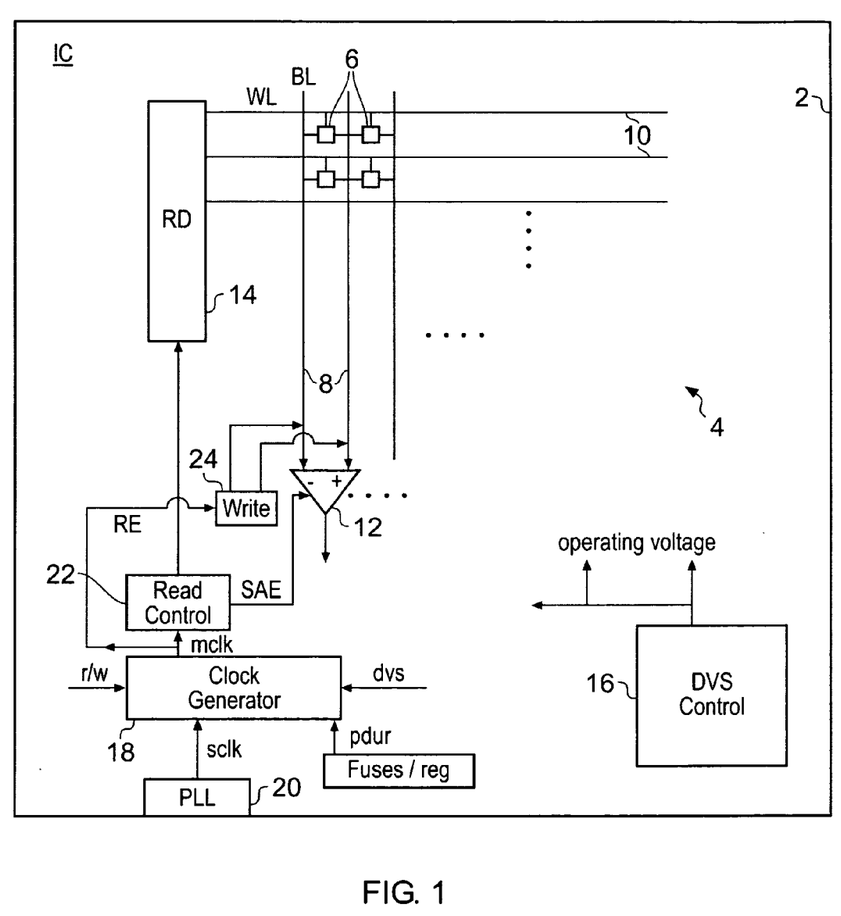
FIG. 1 schematically illustrates an integrated circuit including a memory and clock generator circuitry.

FIG. 1 illustrates an integrated circuit 2 including a memory 4 in the form of an array of bit storage cells 6 coupled to bit lines 8 and word lines 10. Sense amplifiers 12 are provided to detect voltage differences between the bit line signals on the bit lines 8 due to discharge of one of the signals through the bit storage cell 6. A row decoder 14 is used to decode a memory address to select one of the rows of bit storage cells 6 to be coupled to the bit lines 8 and accordingly read via the sense amplifiers 12. The selected row is activated by a signal on one of the word lines 10.

A dynamic voltage scaling control unit 16 is provided on the integrated circuit 2 to change the operating voltage for at least the memory 4 to match the requirements at particular times. It may be that in a certain state power consumption is more important that performance and the voltage may be reduced by the dynamic voltage scaling unit 16 to reduce power consumption at the cost of decreasing read speed and write speed. Conversely, at other times performance may be more important than power consumption and a higher operating voltage may be selected. Between these extremes a variety of different operating voltages may be employed to match the individual circumstances and to tune the performance characteristics of the memory 4 to match the operational circumstances concerned. This type of dynamic voltage scaling operation will be familiar to those in this technical field and will not be described further herein.

Clock generator circuitry 18 is provided within the integrated circuit 2 and serves to receive a source clock signal sclk from phase-locked-loop circuitry 20 and to generate therefrom a memory clock signal mclk which is used to control read operations and write operations of the memory 4. The clock generator circuitry 18 has two modes of operation. In the first mode of operation the memory clock signal mclk is generated in dependence upon both the rising edge and the falling edge of the source clock signal sclk. As the phase-locked-loop circuitry 20 is highly stable in the nature of the source clock signal sclk it generates, the clock generator circuitry 18 can generate a highly stable memory clock signal mclk therefrom. In a second mode of operation, the clock generator circuitry 18 generates a self-timed clock pulse starting from one of the edges of the source clock signal sclk (e.g. a self-timed pulse triggered from the rising edge of the source clock signal sclk). This self-timed pulse can have its pulse duration controlled by a delay line (not shown in FIG. 1) seeking to model the behaviour of the memory 4 and to track variations in the behaviour of the memory 4 due to variations in environmental conditions and manufacture, e.g. process, voltage and temperature variations. The memory clock signal mclk is supplied to a read controller 22 which uses the rising edge of the pulse to initiate the read operation from the bit storage cells 6 via the row decoder 14. The falling edge of the pulse is used to generate a sense amplifier enable signal SAE supplied to the sense amplifiers 12 to read the differential voltage between the bit lines 8 and accordingly read out the data values from the bit storage cells 6. Increasing the pulse duration has the effect of increasing the time during which one of the bit lines 8 is discharged in dependence upon the data value stored within the bit storage cells 6 and accordingly the magnitude of the voltage to be sensed by the sense amplifier 12. An excessively long pulse duration will result in a longer than necessary discharge and accordingly an increased energy consumption to recharge the bit lines 8 back to their fully charged states. Similarly, an excessively long pulse duration will delay the time before which the sense amplifier 12 is able to output the data value read from the bit storage cells 6 and accordingly the time before which the data value can be returned from the memory 4.

The memory clock signal mclk is also supplied to a write controller 24 which is used to write data values into the bit storage cells 6. A set of bit storage cells 6 to be coupled to the bit lines 8 is selected by the row decoder 14 and the word lines 10. Signal values are then imposed upon the bit lines 8 by the write controller 24 and used to overpower the feedback within the bit storage cells 6 so as to impose new data values to be stored therein. The time required to perform such a write operation will typically be longer than that required for a read operation.

As discussed above, the clock generator circuitry 18 is operable in either of two modes. The active mode at any time can be selected in dependence upon a number of characteristics such as whether a read or a write operation is being performed (R/W signal) and what is the current operating voltage of the memory 4 (DVS signal). As an example, when write operations are being performed, then the first mode of memory clock signal mclk may be employed in which both the rising edge and the falling edge of the source clock signal sclk are used and a duration of time during which the write operation can be performed is substantially guaranteed to have a known value as controlled by the source clock signal sclk generated by the phase-locked-loop circuitry 20. When performing a read operation at the lowest operating voltage of the memory 4, or in other circumstances where self-timed operation is not appropriate, the first mode of operation for the clock generator circuitry may also be active. When performing a read operation in other than this lowest operating voltage state, the second mode of operation can be active upon the clock generator circuitry 18. In this mode of operation, the pulse duration of the memory clock signal mclk is controlled by self-timed delay circuitry within the clock generator circuitry 18. This will generally provide for more aggressive operation of the memory 18 in a manner which improves read speed and reduces power consumption, but which not be sufficiently reliable at the lowest operating voltage.

Figure 2:
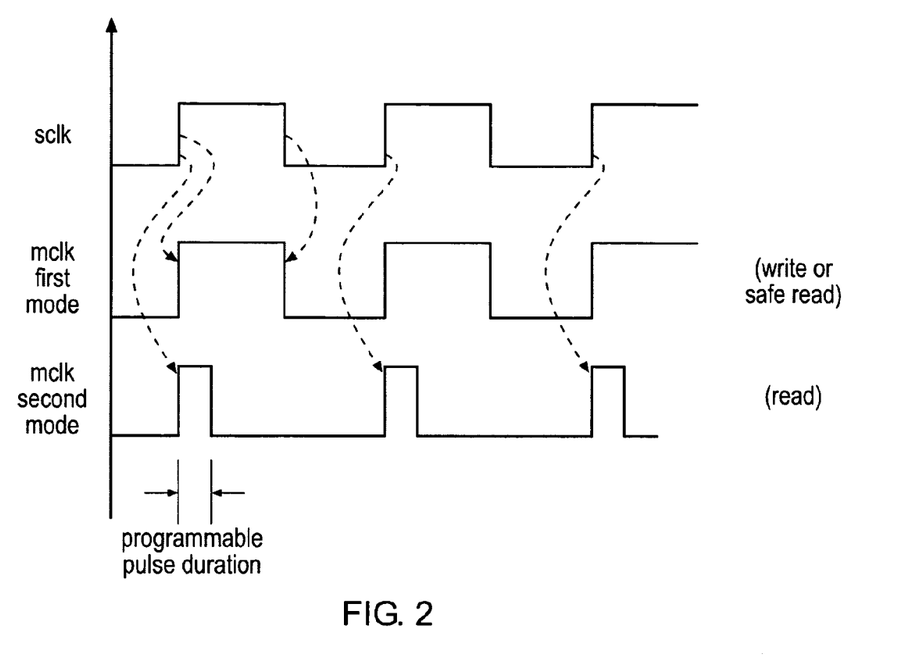
FIG. 2 is a signal diagram schematically illustrating the relationship between a source clock signal and a memory clock signal generated in a first mode of operation and in a second mode of operation.

FIG. 2 is a signal diagram schematically illustrating the relationship between the source clock signal sclk and the memory clock signal mclk in the various modes of operation. As seen, in the first mode of operation the rising edge of the memory clock signal mclk follows the rising edge of the source clock signal sclk. Similarly, the falling edge of the memory clock signal mclk in the first mode follows the falling edge of the source clock signal sclk. There is a one-to-one correspondence between the memory clock signal mclk and the source clock signal sclk in this example, but it will be appreciated that a frequency multiplied or frequency divided relationship may apply if desired.

In the second mode of operation, it will be seen that the rising edge of the memory clock signal mclk is triggered by the rising edge of the source clock signal sclk. However, the pulse duration of the memory clock signal mclk in the second mode is self-timed and is not dependant upon the falling edge of the source clock signal sclk. This pulse duration may be programmable to a selected one of a plurality of different self-timed target values.

The first mode of operation using the first type of memory clock signal mclk generation is appropriately used for all write operations and for safe read operations, such as when operating at the lowest operating voltage level or in other circumstances where a substantially guaranteed safe read is desired. Conversely, the second mode of memory clock signal mclk generation is appropriate to read operation other than the safe read discussed above.

Figure 3:
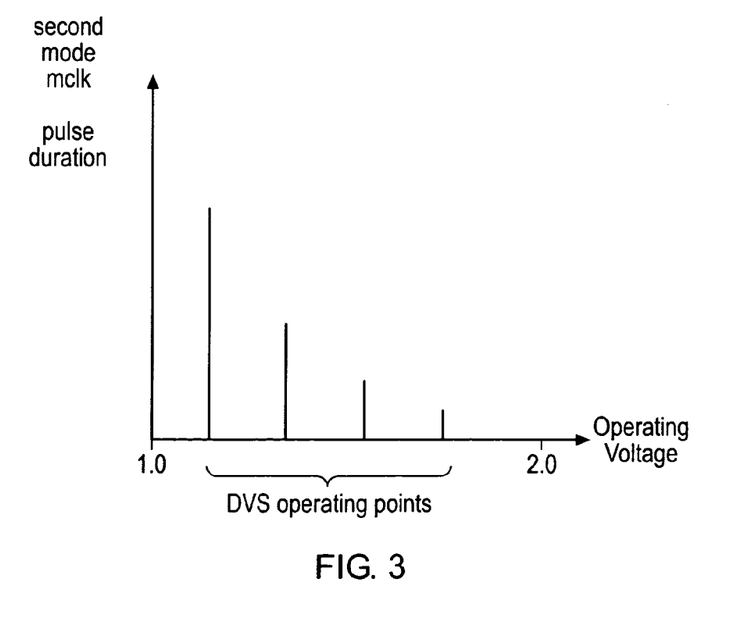
FIG. 3 is a diagram schematically illustrating the variation of pulse duration with operating voltage when generating a memory clock signal using a second mode.

FIG. 3 illustrates the variation in memory clock signal mclk pulse duration in the second mode of operation with operating voltage. As illustrated, as the operating voltage increases (i.e. with an increase in dynamic voltage scaling of the operating point), the pulse duration may decrease. The relationship between pulse duration and operating voltage is non-linear (e.g. in this preferred example logarithmic) in order to provide a wide range of possibilities.

Figure 4:
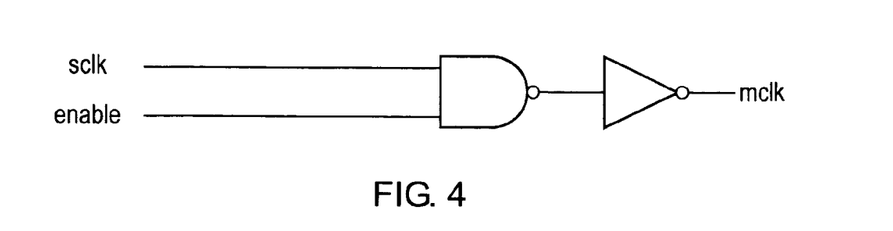
FIG. 4 is a circuit diagram schematically illustrating generation of a memory clock signal in dependence upon a source clock signal using a first mode.

FIG. 4 is an example of simple circuitry for generating a memory clock signal mclk from a source clock signal sclk. In this simple example, there is a one-to-one frequency relationship between these two clock signals and the memory clock signal mclk is simply gated with an enable signal to be either active or inactive. This form of circuitry can be used for the first mode of operation of the clock generator circuitry 18.

Figure 5:
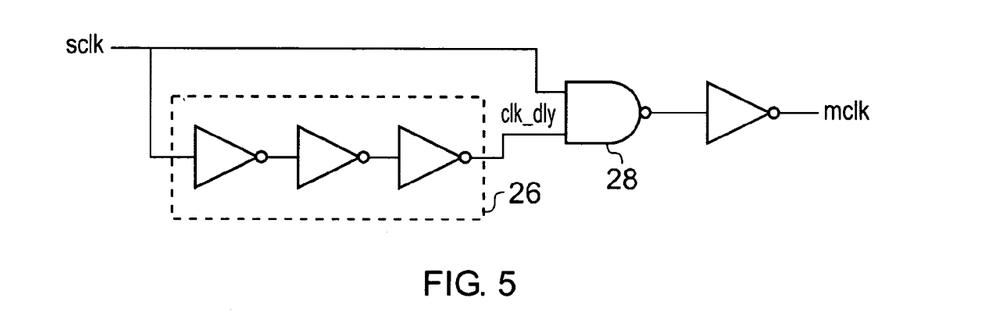
FIGS. 5 and 6 schematically illustrate circuits for generating a memory clock signal from a source clock signal in accordance with a second mode.

FIG. 5 schematically illustrates a clock generator for generating a memory clock signal mclk having a pulse duration controlled by the delay time for a delay line 26. The rising edge of the source clock signal sclk triggers a rising edge in the memory clock signal mclk. The delayed rising edge of the source clock signal sclk propagating through the delay line 26 then forms the falling edge of the memory clock signal mclk when it reaches the NAND gate 28.

Figure 6:
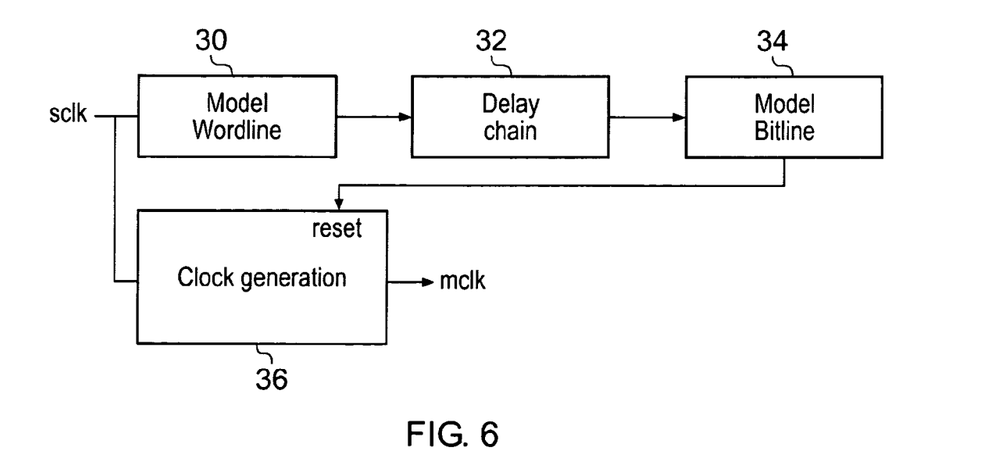

FIG. 6 represents a more sophisticated version of the circuitry of FIG. 5. In this example the delay line 26 has been replaced with a model wordline circuit 30, a delay chain circuit 32 and a model bit line circuit 34 each seeking to model the delay in processing performed by the corresponding elements within the memory 4 (word line, bit storage cells, bit lines). These delay elements 30, 32, 34 are connected in series and when their cumulative delay period has passed the propagated edge serves to reset a clock generation circuit 36 which was set by the rising edge of the source clock signal sclk. This forms the falling edge of the memory clock signal mclk. The form of circuitry illustrated in FIGS. 5 and 6 can be used to perform the second mode of clock signal generation in accordance with the present technique in which the self-timed pulse is triggered by one edge of the source clock signal sclk and the other edge of the pulse is internally derived by self-timing delay mechanisms.

Figure 7:
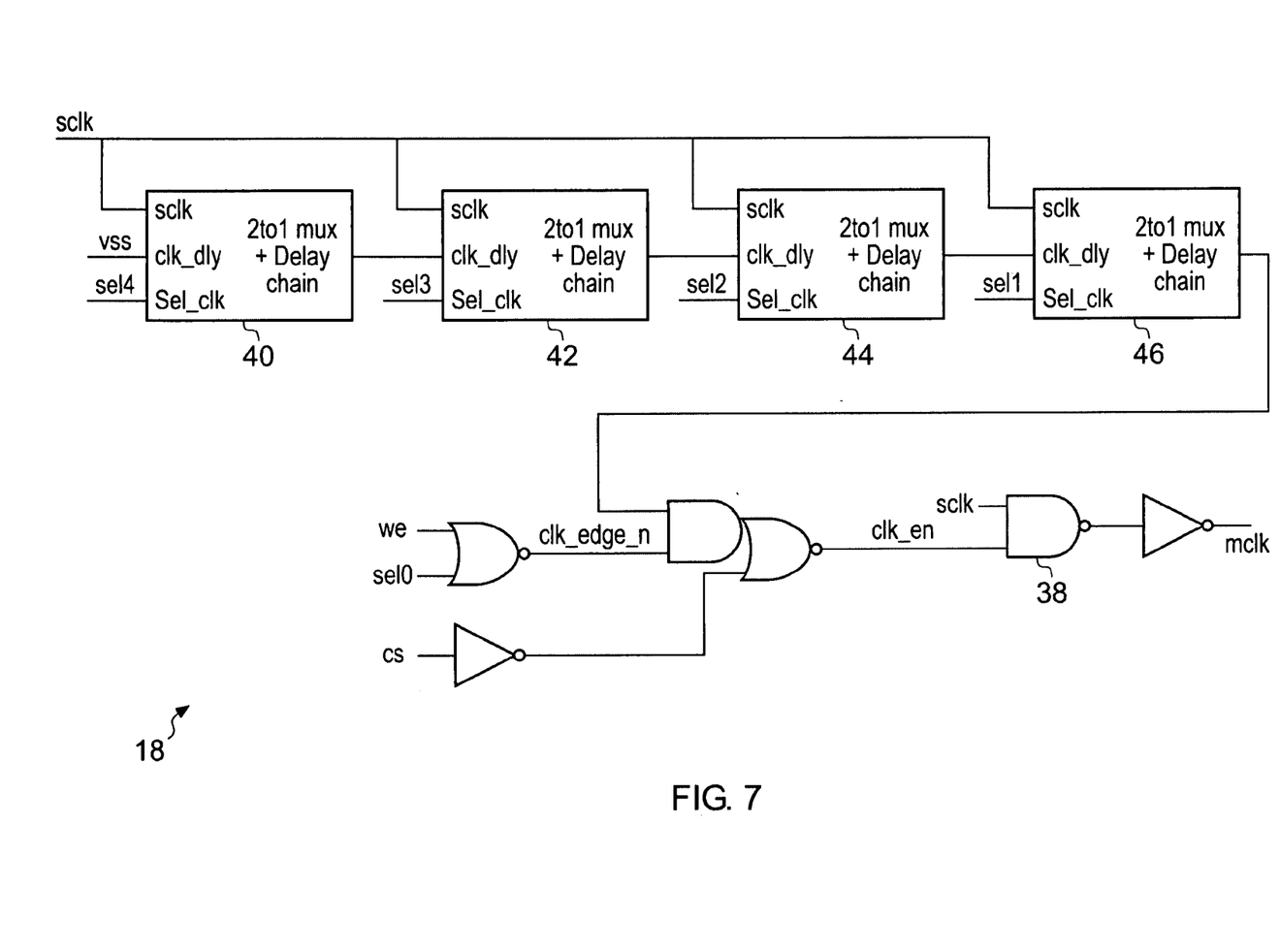
FIG. 7 schematically illustrates hybrid clock generator circuitry having a first mode of operation and a second mode of operation.

FIG. 7 schematically illustrates hybrid clock generator circuitry 18 formed using a combination of the techniques of FIGS. 4, 5 and 6. This example circuitry is responsive to whether a read or a write operation is being performed (via the write enable signal we), but is simplified in that the control in dependence upon operating voltage is not directly performed but is instead performed by an appropriate selection of the pulse duration selecting signal (se10-se14). When operating in the first mode, due to either an active write enable signal we or active se10 signal, then providing the chip select signal cs is active, the clock enable signal clk_en will be permanently low and the memory clock signal mclk will be derived directly from the source clock signal sclk applied at NAND gate 38.

When the write enable signal we is not asserted and the pulse duration selecting signal se10 is not asserted, then the clock generator circuitry 18 will operate in accordance with the second mode using selected ones of the delay chains 40, 42, 44, 46. The pulse delay specifying signal uses "one hot" encoding such that only one of the signals se10 to se104 will be active at any one time. With this second mode of operation, the rising edge of the memory clock signal mclk will be triggered by the rising edge in the source clock signal sclk applied at NAND gate 38 and the falling edge of the memory clock signal mclk will be determined by the appropriately selected delay path through the delay chains 40, 42, 44, 46 as expressed by the change in the signal value clk_en applied at the NAND gate 38.

Figure 8:
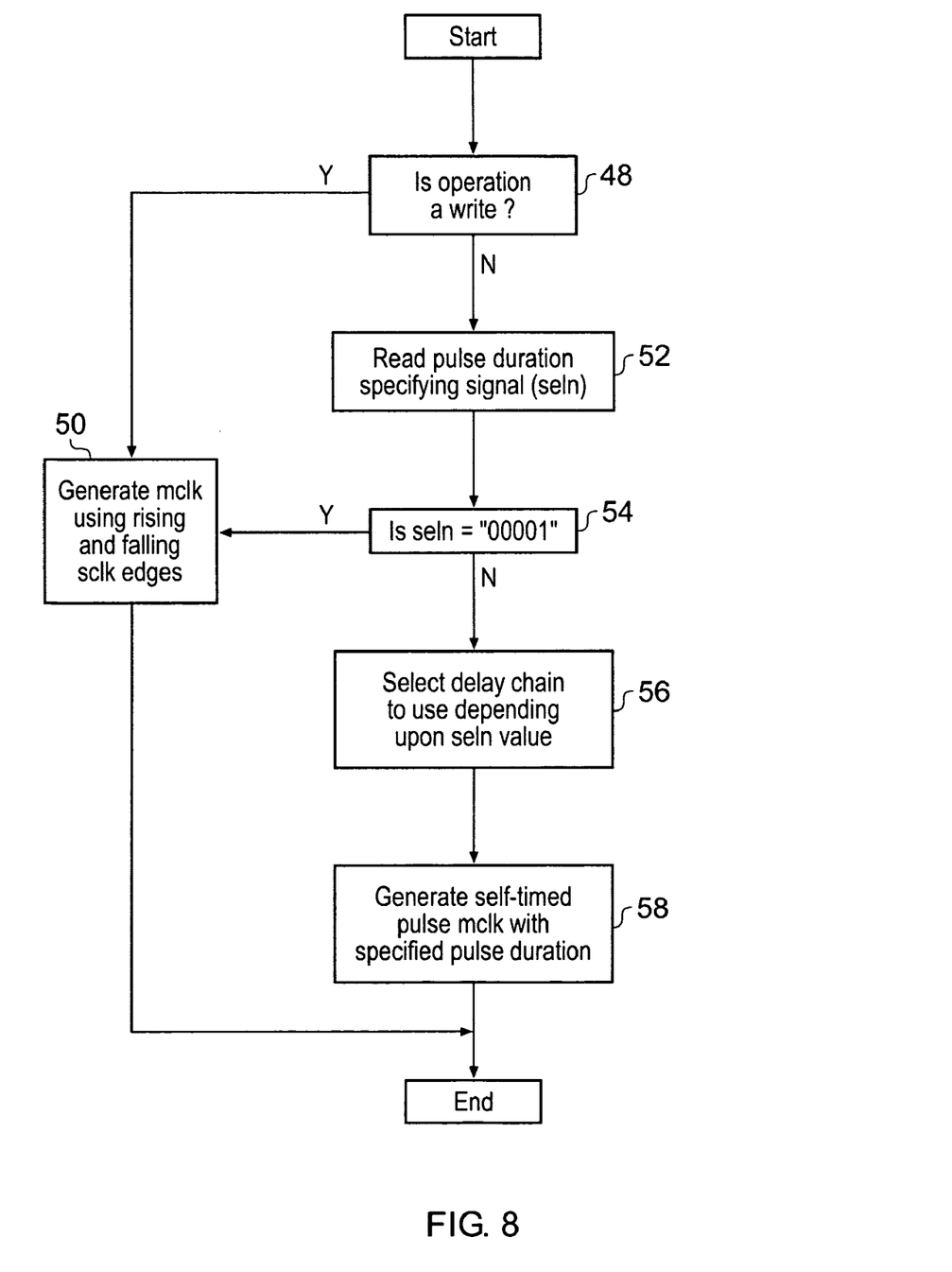
FIG. 8 is a flow diagram schematically illustrating the operation of the circuitry of FIG. 7.

FIG. 8 is a flow diagram schematically illustrating the operation of the circuit of FIG. 7. It will be appreciated that the flow diagram of FIG. 8 shows this operation as a serial sequence of steps, whereas it will be appreciated that these may in practice be performed in parallel, or at least in some different order, during the operation of the circuitry of FIG. 7. Nevertheless, the flow diagram of FIG. 8 is useful in logically understanding the operation of the clock generator circuitry 18. At step 48 it is determined whether a write operation is to be performed. If a write operation is to be performed, then processing proceeds to step 50 where the second mode of clock signal generation is adopted in which the memory clock signal mclk is generated using both the rising and falling edges of the source clock signal sclk. If the operation is not a write, then processing proceeds to step 52 where the pulse duration specifying signal (se1n) is read. If the pulse duration specifying signal is "00001", then this is determined at step 54 and processing again proceeds to step 50 and the first mode of operation is adopted. If the operation is not a write and the pulse duration specifying signal is not "00001", then step 56 serves to select the appropriate one or ones of the delay chains 40, 42, 44 and 46 to be used to control the pulse duration and then step 58 generates a self-timed pulse giving a memory clock signal mclk with the required/specified pulse duration.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An integrated circuit comprising:
   a memory; and
   clock generator circuitry, responsive to a source clock signal, for providing a memory clock signal to said memory, wherein:
   in a first mode of operation said clock generator circuitry is configured to generate said memory clock signal in response to rising and falling edges of said source clock signal; and
   in a second mode of operation said clock generator circuitry is configured to generate said memory clock signal as a self-timed pulse triggered in response to an edge of said source clock signal.

2. An integrated circuit as claimed in claim 1, wherein said clock generator circuitry operates in said first mode during a write operation to said memory.

3. An integrated circuit as claimed in claim 1, wherein said clock generator circuitry operates in either said first mode or said second mode during a read operation from said memory.

4. An integrated circuit as claimed in claim 1, wherein said memory comprises one of:
   a RAM memory;
   a cache memory; and
   a register file memory.

5. An integrated circuit as claimed in claim 1, wherein said memory comprises a plurality of bit storage cells coupled to a plurality of bit lines with respective sense amplifiers for sensing signal values thereupon.

6. An integrated circuit as claimed in claim 5, wherein
   said clock generator circuitry is operated in said second mode when reading a bit value from a bit storage cell of said plurality of bit storage cells;
   said memory clock signal has an active phase corresponding to said pulse duration;
   said bit storage cell is coupled to one or more of said plurality of bit lines to discharge at least one signal thereupon during said active phase; and
   a trailing edge of said active phase triggers at least one of said sense amplifiers to read a signal value upon a bit line.

7. An integrated circuit as claimed in claim 1, wherein when operating in said second mode said clock generator circuitry is responsive to a pulse duration specifying signal to generate said memory clock signal as a self-timed pulse with a pulse duration controlled by said pulse duration specifying signal.

8. An integrated circuit as claimed in claim 7, wherein said clock generator circuitry comprises a plurality of delay lines selected for use in dependence upon said pulse duration specifying signal to respectively generate self-timed pulses with different pulse durations.

9. An integrated circuit as claimed in claim 7, wherein said memory is operated at a dynamically selectable one of a plurality of different operating voltages and said pulse duration specifying signal is varied in dependence upon operating voltage such that said pulse duration varies with operating voltage.

10. An integrated circuit as claimed in claim 9, wherein when using at least a lowest operating voltage, said clock generator circuitry operates in said first mode during a write operation from said memory.

11. An integrated circuit as claimed in claim 9, wherein when using at least a highest operating voltage, said clock generator circuitry operates in said second mode during a read operation from said memory.

12. An integrated circuit as claimed in claim 7, wherein said pulse duration specifying signal is one of a fixed value and a dynamically adjustable value during operation of said integrated circuit.

13. An integrated circuit as claimed in claim 12, wherein said one of said fixed value and said dynamically adjustable value is one of:
   set by fusible links during manufacture of said integrated circuit; and
   set by programming a configuration register when initialising said integrated circuit.

14. An integrated circuit as claimed in claim 7, wherein said pulse duration varies non-linearly with said pulse duration specifying signal.

15. An integrated circuit as claimed in claim 14, wherein said pulse duration is set to one of a plurality of logarithmically varying values by said pulse duration specifying signal.

16. An integrated circuit as claimed in claim 1, wherein said source clock signal is generated by phase-locked-loop circuitry.

17. An integrated circuit as claimed in claim 1, wherein said memory comprises a plurality of bit storage cells and said clock generator circuitry is operated in said first mode to generate a memory clock signal substantially independent of variations dependent upon said instance of said integrated circuit when writing to a bit storage cell of said plurality of bit storage cells.

18. An integrated circuit as claimed in claim 17, wherein variations dependent upon said instance of said integrated circuit comprise one of more of variations dependent upon:
   manufacturing process;
   operating voltage; and
   operating temperature.

19. An integrated circuit comprising:
   a memory; and
   clock generator circuitry having a source clock input to receive a source clock signal and a memory clock output coupled to said memory to supply a memory clock signal to said memory; wherein
   in a first mode of operation said clock generator circuitry generates said memory clock signal in response to rising and falling edges of said source clock signal; and
   in a second mode of operation said clock generator circuitry generates said memory clock signal as a self-timed pulse triggered in response to an edge of said source clock signal, wherein when operating in said second mode said clock generator circuitry is responsive to a pulse duration specifying signal to generate said memory clock signal as a self-timed pulse with a pulse duration controlled by said pulse duration specifying signal.

20. An integrated circuit as claimed in claim 19, wherein said clock generator circuitry comprises a plurality of delay lines selected for use in dependence upon said pulse duration specifying signal to respectively generate self-timed pulses with different pulse durations.

21. An integrated circuit as claimed in claim 19, wherein said memory is operated at a dynamically selectable one of a plurality of different operating voltages and said pulse duration specifying signal is varied in dependence upon operating voltage such that said pulse duration varies with operating voltage.

22. An integrated circuit as claimed in claim 21, wherein when using at least a lowest operating voltage, said clock generator circuitry operates in said first mode during a write operation from said memory.

23. An integrated circuit as claimed in claim 21, wherein when using at least a highest operating voltage, said clock generator circuitry operates in said second mode during a read operation from said memory.

24. An integrated circuit as claimed in claim 19, wherein said pulse duration specifying signal is one of a fixed value and a dynamically adjustable value during operation of said integrated circuit.

25. An integrated circuit as claimed in claim 24, wherein said one of said fixed value and said dynamically adjustable value is one of:
   set by fusible links during manufacture of said integrated circuit; and
   set by programming a configuration register when initialising said integrated circuit.

26. An integrated circuit as claimed in claim 19, wherein said pulse duration varies non-linearly with said pulse duration specifying signal.

27. An integrated circuit as claimed in claim 26, wherein said pulse duration is set to one of a plurality of logarithmically varying values by said pulse duration specifying signal.

28. An integrated circuit comprising:
   a memory; and
   clock generator circuitry having a source clock input to receive a source clock signal and a memory clock output coupled to said memory to supply a memory clock signal to said memory; wherein
   in a first mode of operation said clock generator circuitry generates said memory clock signal in response to rising and falling edges of said source clock signal; and
   in a second mode of operation said clock generator circuitry generates said memory clock signal as a self-timed pulse triggered in response to an edge of said source clock signal, wherein said source clock signal is generated by phase-locked-loop circuitry.

29. An integrated circuit comprising:
   a memory; and
   clock generator circuitry having a source clock input to receive a source clock signal and a memory clock output coupled to said memory to supply a memory clock signal to said memory; wherein
   in a first mode of operation said clock generator circuitry generates said memory clock signal in response to rising and falling edges of said source clock signal; and
   in a second mode of operation said clock generator circuitry generates said memory clock signal as a self-timed pulse triggered in response to an edge of said source clock signal, wherein said memory comprises a plurality of bit storage cells and said clock generator circuitry is operated in said first mode to generate said memory clock signal substantially independent of variations dependent upon said instance of said integrated circuit when writing to a bit storage cell of said plurality of bit storage cells.

30. An integrated circuit as claimed in claim 29, wherein variations dependent upon said instance of said integrated circuit comprise one of more of variations dependent upon:
   manufacturing process;
   operating voltage; and
   operating temperature.

31. An integrated circuit comprising:
   memory means;
   clock generator means for generating a memory clock signal in response to a source clock signal and for supplying a memory clock signal to said memory means; wherein
   in a first mode of operation said clock generator means generates said memory clock signal in response to rising and falling edges of said source clock signal; and
   in a second mode of operation said clock generator means generates said memory clock signal as a self-timed pulse triggered in response to an edge of said source clock signal.

32. A method of operating an integrated circuit comprising the steps of:
   storing data in a memory of said integrated circuit; and
   generating a memory clock signal in response to a source clock signal using a clock generator circuitry and a memory clock signal to said memory; wherein
   in a first mode of operation said clock generator circuitry is configured to generate said memory clock signal in response to rising and falling edges of said source clock signal; and
   in a second mode of operation said clock generator circuitry is configured to generate said memory clock signal as a self-timed pulse triggered in response to an edge of said source clock signal.

33. A method as claimed in claim 32, wherein said clock generator circuitry operates in said first mode during a write operation to said memory.

34. A method as claimed in claim 32, wherein said clock generator circuitry operates in either said first mode or said second mode during a read operation from said memory.

35. A method as claimed in claim 32, wherein said memory comprises one of:
   a RAM memory;
   a cache memory; and
   a register file memory.

36. A method as claimed in claim 32, wherein said memory comprises a plurality of bit storage cells coupled to a plurality of bit lines with respective sense amplifiers for sensing signal values thereupon.

37. A method as claimed in claim 36, wherein
   said clock generator circuitry is operated in said second mode when reading a bit value from a bit storage cell of said plurality of bit storage cells;
   said memory clock signal has an active phase corresponding to said pulse duration;
   said bit storage cell is coupled to one or more of said plurality of bit lines to discharge at least one signal thereupon during said active phase; and
   a trailing edge of said active phase triggers at least one of said sense amplifiers to read a signal value upon a bit line.

38. A method as claimed in claim 32, wherein when operating in said second mode said clock generator circuitry is responsive to a pulse duration specifying signal to generate said memory clock signal as a self-timed pulse with a pulse duration controlled by said pulse duration specifying signal.

39. A method as claimed in claim 38, wherein said clock generator circuitry comprises a plurality of delay lines selected for use in dependence upon said pulse duration specifying signal to respectively generate self-timed pulses with different pulse durations.

40. A method as claimed in claim 38, wherein said memory is operated at a dynamically selectable one of a plurality of different operating voltages and said pulse duration specifying signal is varied in dependence upon operating voltage such that said pulse duration varies with operating voltage.

41. A method as claimed in claim 40, wherein when using at least a lowest operating voltage, said clock generator circuitry operates in said first mode during a read operation from said memory.

42. A method as claimed in claim 40, wherein when using at least a highest operating voltage, said clock generator circuitry operates in said second mode during a read operation from said memory.

43. A method as claimed in claim 38, wherein said pulse duration specifying signal is one of a fixed value and a dynamically adjustable value during operation of said integrated circuit.

44. A method as claimed in claim 43, wherein said one of said fixed value and said dynamically adjustable value is one of:
   set by fusible links during manufacture of said integrated circuit; and
   set by programming a configuration register when initialising said integrated circuit.

45. A method as claimed in claim 38, wherein said pulse duration varies non-linearly with said pulse duration specifying signal.

46. A method as claimed in claim 45, wherein said pulse duration is set to one of a plurality of logarithmically varying values by said pulse duration specifying signal.

47. A method as claimed in claim 32, wherein said source clock signal is generated by phase-locked-loop circuitry.

48. A method as claimed in claim 32, wherein said memory comprises a plurality of bit storage cells and said clock generator circuitry is operated in said first mode to generate a memory clock signal substantially independent of variations dependent upon said instance of said integrated circuit when writing to a bit storage cell of said plurality of bit storage cells.

49. A method as claimed in claim 48, wherein variations dependent upon said instance of said integrated circuit comprise one of more of variations dependent upon:
   manufacturing process;
   operating voltage; and
   operating temperature.

50. A method as claimed in claim 32, wherein said memory comprises a plurality of bit storage cells coupled to a plurality of bit lines with respective sense amplifiers for sensing signal values thereupon.

51. A method as claimed in claim 50, wherein
   said clock generator circuitry is operated in said second mode when reading a bit value from a bit storage cell of said plurality of bit storage cells;
   said memory clock signal has an active phase corresponding to said pulse duration;
   said bit storage cell is coupled to one or more of said plurality of bit lines to discharge at least one signal thereupon during said active phase; and
   a trailing edge of said active phase triggers at least one of said sense amplifiers to read a signal value upon a bit line.

52. A method of operating an integrated circuit comprising the steps of:
   storing data in a memory of said integrated circuit; and
   generating a memory clock signal from a source clock signal using a clock generator circuitry having a source clock input to receive said source clock signal and a memory clock output coupled to said memory to supply said memory clock signal to said memory; wherein
   in a first mode of operation said clock generator circuitry generates said memory clock signal in response to rising and falling edges of said source clock signal; and
   in a second mode of operation said clock generator circuitry generates said memory clock signal as a self-timed pulse triggered in response to an edge of said source clock signal, wherein when operating in said second mode said clock generator circuitry is responsive to a pulse duration specifying signal to generate said memory clock signal as a self-timed pulse with a pulse duration controlled by said pulse duration specifying signal.

53. A method as claimed in claim 52, wherein said clock generator circuitry comprises a plurality of delay lines selected for use in dependence upon said pulse duration specifying signal to respectively generate self-timed pulses with different pulse durations.

54. A method as claimed in claim 52, wherein said memory is operated at a dynamically selectable one of a plurality of different operating voltages and said pulse duration specifying signal is varied in dependence upon operating voltage such that said pulse duration varies with operating voltage.

55. A method as claimed in claim 54, wherein when using at least a lowest operating voltage, said clock generator circuitry operates in said first mode during a read operation from said memory.

56. A method as claimed in claim 54, wherein when using at least a highest operating voltage, said clock generator circuitry operates in said second mode during a read operation from said memory.

57. A method as claimed in claim 52, wherein said pulse duration specifying signal is one of a fixed value and a dynamically adjustable value during operation of said integrated circuit.

58. A method as claimed in claim 57, wherein said one of said fixed value and said dynamically adjustable value is one of:
   set by fusible links during manufacture of said integrated circuit; and
   set by programming a configuration register when initialising said integrated circuit.

59. A method as claimed in claim 52, wherein said pulse duration varies non-linearly with said pulse duration specifying signal.

60. A method as claimed in claim 59, wherein said pulse duration is set to one of a plurality of logarithmically varying values by said pulse duration specifying signal.

61. A method of operating an integrated circuit comprising the steps of:
   storing data in a memory of said integrated circuit; and
   generating a memory clock signal from a source clock signal using a clock generator circuitry having a source clock input to receive said source clock signal and a memory clock output coupled to said memory to supply said memory clock signal to said memory; wherein
   in a first mode of operation said clock generator circuitry generates said memory clock signal in response to rising and falling edges of said source clock signal; and
   in a second mode of operation said clock generator circuitry generates said memory clock signal as a self-timed pulse triggered in response to an edge of said source clock signal, wherein said source clock signal is generated by phase-locked-loop circuitry.

62. A method of operating an integrated circuit comprising the steps of:

storing data in a memory of said integrated circuit; and generating a memory clock signal from a source clock signal using a clock generator circuitry having a source clock input to receive said source clock signal and a memory clock output coupled to said memory to supply said memory clock signal to said memory; wherein in a first mode of operation said clock generator circuitry generates said memory clock signal in response to rising and falling edges of said source clock signal; and in a second mode of operation said clock generator circuitry generates said memory clock signal as a self-timed pulse triggered in response to an edge of said source clock signal, wherein said memory comprises a plurality of bit storage cells and said clock generator circuitry is operated in said first mode to generate said memory clock signal substantially independent of variations dependent upon said instance of said integrated circuit when writing to a bit storage cell of said plurality of bit storage cells.

63. A method as claimed in claim 62, wherein variations dependent upon said instance of said integrated circuit comprise one of more of variations dependent upon:
  manufacturing process;
  operating voltage; and
  operating temperature.

* * * * *